United States Patent [19]

Watanabe et al.

[11] Patent Number: 4,526,854
[45] Date of Patent: Jul. 2, 1985

[54] PHOTORESIST COMPOSITION WITH WATER SOLUBLE BISAZIDE AND DIAZO COMPOUND

[75] Inventors: Shingo Watanabe, Himeji; Takeo Itou, Fukaya, both of Japan

[73] Assignee: Tokyo Shibaura Denki Kabushiki Kaisha, Saitama, Japan

[21] Appl. No.: 467,895

[22] Filed: Feb. 18, 1983

Related U.S. Application Data

[63] Continuation-in-part of Ser. No. 413,895, Sep. 1, 1982.

[51] Int. Cl.$^3$ .................. G03C 1/54; G03C 1/60; G03C 1/71
[52] U.S. Cl. ........................ 430/176; 430/28; 430/143; 430/145; 430/175; 430/179; 430/194; 430/196; 430/197
[58] Field of Search ............... 430/175, 176, 194, 197, 430/143, 145, 172, 156, 28, 179, 196

[56] References Cited

U.S. PATENT DOCUMENTS

| | | | |
|---|---|---|---|
| 2,695,846 | 11/1954 | Mally | 430/197 |
| 2,937,085 | 5/1960 | Seven et al. | 430/302 |
| 3,387,975 | 6/1968 | Tamura | 430/28 |
| 3,679,419 | 7/1972 | Gillich | 430/302 |
| 3,917,794 | 11/1975 | Akagi et al. | 430/25 |
| 4,347,300 | 8/1982 | Shimazu et al. | 430/156 |

FOREIGN PATENT DOCUMENTS

| | | | |
|---|---|---|---|
| 53-59506 | 5/1978 | Japan | 430/28 |
| 56-06530 | 2/1981 | Japan | 430/145 |

OTHER PUBLICATIONS

Research Disclosure, No. 134, pp. 48-49, 6/1975.

*Primary Examiner*—Charles L. Bowers, Jr.
*Attorney, Agent, or Firm*—Cushman, Darby & Cushman

[57] ABSTRACT

A method for forming a pattern of a non-light-emitting black material on the inner surface of a faceplate of a color cathode ray tube is provided, which comprises the steps of forming a photoresist layer of a photoresist containing a water-soluble bisazidocompound, a water-soluble diazocompound, and a water-soluble polymeric material, on an inner surface of a faceplate of a color cathode ray tube, selectively exposing parts of the photoresist layer using a shadow mask so as to photocure the exposed parts, developing the photoresist layer to remove unexposed parts of the photoresist layer, thereby forming dots of the photoresist, forming a film of a non-light-emitting black material on the inner surface of the faceplate including the dots, and removing the dots and the non-light-emitting black material on the dots so as to form holes in the film of the non-light-emitting black material.

2 Claims, 4 Drawing Figures

PHOTORESIST COMPOSITION WITH WATER SOLUBLE BISAZIDE AND DIAZO COMPOUND

This application is a continuation-in-part of application Ser. No. 413,895 filed on Sept. 1, 1982.

BACKGROUND OF THE INVENTION

The present invention relates to a method for forming a pattern and to a photoresist used therein and, more particularly, to a method for forming a pattern of a non-light-emitting black material on the inner surface of a faceplate of a color picture tube or a cathode ray tube and to a photoresist used therein.

A photoresist is used for forming a pattern of a non-light-emitting black material on the inner surface of a faceplate of a color picture tube. The photoresist used for this purpose must satisfy many requirements; it must be water-soluble, have high sensitivity, have high adhesion strength, have no dark reaction, have no thermal fog, have good developing characteristics and allow easy removal of a photocured photoresist film.

In general, a phosphor screen of a color picture tube is prepared by a series of steps presented below including a step for forming a pattern of a non-light-emitting black material:

(1) Resist coating: A photoresist is coated on the inner surface of a faceplate, and is then dried to form a photoresist film.

(2) Exposure: A shadow mask is formed which has holes for allowing passage of an electron beam therethrough. The light is radiated onto the photoresist film through the shadow mask to form photocured dots for holes for embedding primary phosphors for R (red), G (green), and B (blue).

(3) Developing: After removing the shadow mask, the photoresist film is rinsed with water to leave the photocured dots and remove the remainder of the film.

(4) Formation of non-light-emitting black material film: A colloidal black carbon suspension is coated on the inner surface of the faceplate and is dried.

(5) Removal: A removal solution is applied to remove the photocured dots of the photoresist, thus formating the holes in the non-light-emitting black material film.

(6) Layers of primary phosphors for R, G and B are formed on the non-light-emitting black material film including the holes.

Photoresists to be used for forming a pattern of a non-light-emitting black material on the inner surface of a faceplate of a color picture tube are conventionally known by several names, such as a PVA-ADC-type photoresist consisting of polyvinyl alcohol (PVA) and ammonium dishromate (ADC) or sodium dichromate; a so-called PVA-diazocompound-type photoresist consisting of PVA and a water-soluble diazocompound; a so-called PVP-azidocompound-type photoresist consisting of polyvinyl pyrrolidone (PVP) and a water-soluble bisazidocompound; and so on.

However, these conventional photoresists are subject to various drawbacks; none of them satisfies all the requirements as described above when they are used to form a pattern of a non-light-emitting black material on the inner surface of a faceplate of a color picture tube.

Although a PVA-ADC-type photoresist is highly sensitive, its sensitivity to the light is subject to large changes depending upon the exposure. Control of the size of the holes to be formed in the non-light-emitting black material film is difficult. Dark reaction and/or thermal blushing may occur. In order to avoid these problems, the working conditions must be carefully set and must be well controlled.

A PVA-diazocompound-type photoresist has a good adhesion strength. However, it has poor developing characteristics and poor sensitivity, providing an impractical photoresist.

Although a PVP-azidocompound-type photoresist has good developing characteristics, it has poor adhesion strength. A pattern may not be formed with good precision unless light of more than a predetermined intensity is radiated thereon.

SUMMARY OF THE INVENTION

It is an object of the present invention to provide a method for forming a fine pattern with good precision.

It is another object of the present invention to provide a method for forming a pattern of a non-light-emitting black material on the inner surface of a faceplate of a color cathode ray tube with good precision and reproducibility.

It is still another object of the present invention to provide a photoresist to be used in the method as described above.

According to an aspect of the present invention, there is provided a method for forming a pattern, comprising the steps of:

forming a photoresist layer of a photoresist containing a water-soluble bisazidocompound, a water-soluble diazocompound, and a water-soluble polymeric material, on an inner surface of a faceplate of a color cathode ray tube;

selectively exposing parts of said photoresist layer using a shadown maks so as to cure said parts;

developing said photoresist layer to remove unexposed parts of said photoresist layer, thereby forming dots of said photoresist;

forming a film of a non-light-emitting black material on said inner surface of said faceplate including said dots; and removing said dots and said non-light-emitting black material on said dots so as to form holes in said film of said non-light-emitting black material.

According to another aspect of the present invention, there is also provided a photoresist comprising a water-soluble bisazidocompound, a water-soluble diazocompound and a water-soluble polymeric material.

In the photoresist, the water-soluble polymeric material is preferably a mixture of polyvinyl pyrrolidone and polyvinyl alcohol. The mixing ratio by weight of polyvinyl pyrrolidone to polyvinyl alcohol is preferably 0.5 to 3 parts polyvinyl pyrrolidone to 1 part of polyvinyl alcohol. The mixing ratio by weight of the water-soluble bisazidocompound to the water-soluble diazocompound is preferably 3 to 7 parts of bisazido compound to 1 part of diazo compound The amount of the water-soluble polymeric material is preferably 0.5 to 50% by weight, more preferably 1 to 10% by weight, based on the total amount of the photoresist. The amount of the bisazidocompound is preferably 1 to 30% by weight, more preferaby 3 to 15% by weight, based on the photoresist.

BRIEF DESCRIPTION OF THE DRAWINGS

FIGS. 1 to 4 are graphs showing the characteristics of a photoresist used in a method for forming a pattern according to the present invention, in which:

FIG. 1 is a graph showing the relationship between the bisazidocompound/diazocompound ratio and sensitivity;

FIG. 2 is a graph showing the relationship between the bisazidocompound/diazocompound ratio and adhesion strength;

FIG. 3 is a graph showing the relationship between the PVP/PVA ratio and adhesion strength when the bisazidocompound/diazocompound is kept constant; and FIG. 4 is a graph showing the relationship between the PVP/PVA ratio and the clearness of the photoresist pattern when the bisazidocompound/diazocompound ratio is kept constant.

DETAILED DESCRIPTION OF THE PREFERRED EMBODIMENTS

Figure 1:
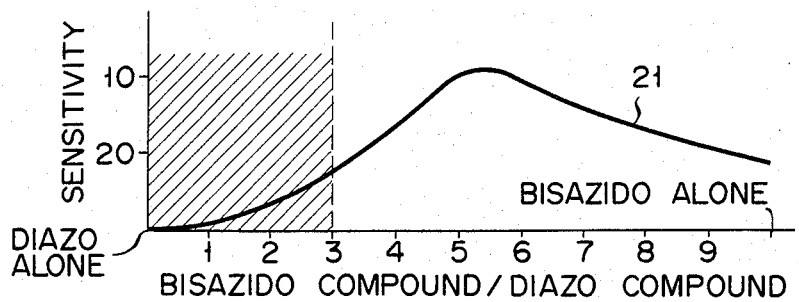

Examples of the water-soluble bisazidocompound to be used here in may include 4,4'-bisazidostilbene-2,2'-disulfonic acid, 4,4'-bisazidobenzalacetophenone-2-sulfonic acid, 4,4'-bisazidostilbene-2-carboxylic acid, and salts thereof.

Examples of the water-soluble diazocompound to be used herein may include benzidine tetrazonium chloride, 3,3'-dimethylbenzidine tetrazonium chloride, 3,3'-dimethoxybenzidine tetrazonium chloride, 4,4'-diaminodiphenylamine tetrazonium chloride, 3,3'-diethylbenzidine tetrazonium sulfate, a formalin condensation product of diazodiphenylamine, and double salts thereof.

Furthermore, examples of the water-soluble polymeric material to be used herein may include a synthetic polymer such as polyvinyl alcohol, polyvinyl pyrrolidone, polyacrylamide, polyvinyl methyl ether, polyvinyl acetate, or polyacrylic acid; a natural polymer such as gelatin, shellac, gum arabic, or casein; a copolymer of methyl vinyl ether with maleic acid, or acrylamide with diacetone acrylamide, or of acrylamide with vinyl alcohol; a grafted polymer such as acrylonitrile grafted polyvinyl alcohol, glycidyl methacrylate grafted polyvinyl alcohol, or β-oxyethyl methacrylate grafted polyvinyl alcohol; and a semisynthetic polymer such as carboxymethyl cellulose, hydroxymethyl cellulose, hydroxypropyl cellulose, or poly-L-glutamic acid (sodium salt).

These water-soluble polymeric materials must be able to be crosslinked by reaction of ultraviolet rays with at least one of a water-soluble bisazidocompound and a water-soluble diazocompound. The water-soluble polymeric material which may be used in the present invention is most preferably a mixture of polyvinyl pyrrolidone and polyvinyl alcohol. In this case, the mixing ratio by weight of polyvinyl pyrrolidone to polyvinyl alcohol is within the range of 0.1 to 8 and preferably within the range of 0.5 to 3. If the mixing ratio is below 0.5, a clear pattern is not formed. On the other hand, if the mixing ratio exceeds 3, adhesion strength is degraded.

If the mixing ratio of polyvinyl pyrrolidone to polyvinyl alcohol is kept within the range mentioned above, the mixing ratio by weight of the water-soluble bisazidocompound to the water-soluble diazocompound is within the range of 1 to 10 and is preferably within the range of 3 to 7. If this mixing ratio is below 3, the photosensitivity is low. On the other hand, if the mixing ratio exceeds 7, adhesion strength is degraded.

The defoaming characteristics and film formability of the photoresist film may be improved by adding a small amount of a surface active agent or a small amount of an alcohol or the like to the photoresist aqueous solution, in addition to the water-soluble polymeric material, the water-soluble bisazidocompound, and the water-soluble diazocompound. Examples of such a surface active agent may include polyethylene glycol, alkylphenoxypolyethylene oxide, phosphoric ester, or sodium hexametaphosphate. Examples of an alcohol or the like may be an alcohol, glycerin, ethylene glycol, sorbitol, and tributyl alcohol.

The present invention will now be described by way of its examples.

EXAMPLE 1

Photoresists of fourteen compositions shown in Table 1 below were prepared and were used to form non-light-emitting black material patterns.

TABLE 1

Composition of Water-Soluble Photoresist
Mixing Ratio (Based on Weight)[Note 5]

| Composition Number (#) | PVP[Note 1]/PVA[Note 2] | Bisazidocompound[Note 3]/ Diazocompound[Note 4] |
|---|---|---|
| 1 | 4 | 5 |
| 2 | 3 | 5 |
| 3 | 2 | 5 |
| 4 | 1.5 | 5 |
| 5 | 1.0 | 5 |
| 6 | 0.5 | 5 |
| 7 | 0.25 | 5 |
| 8 | 1.0 | Diazocompound Alone |
| 9 | 1.0 | 1 |
| 10 | 1.0 | 3 |
| 11 | 1.0 | 5 |
| 12 | 1.0 | 7 |
| 13 | 1.0 | 9 |
| 14 | 1.0 | Bisazidocompound Alone |

[Note 1]: "K-90" (Trade name; manufactured by GAF Co., Ltd., U.S.A.)
[Note 2]: "EG-40" (Trade name; manufactured by Nihon Gosei K.K.)
[Note 3]: 4,4'-bisazidostilbene-2,2'-sodium disulfonate
[Note 4]: Formalin condensation product (phosphate) of diazodiphenylamine
[Note 5]: The mixing ratio by weight of the total amount of PVP and PVA to the amount of the water-soluble photoresist was kept at 0.01, while the mixing ratio by weight of the total amount of the bisazidocompound and the diazocompound to that of PVP and PVA was kept at 0.07. The remainder of the water-soluble photoresist was pure water.

Sensitivity to radiation with ultraviolet rays was examined. The results obtained are shown in FIG. 1 (composition numbers 8 to 14). The sensitivity examined here is defined as the exposure time (at an illumination of 30,000 lux) which is required to form a pattern of 0.190 mm size (at the center) from a hole of 0.200 mm size in the shadown mask in a 20" black strip-type color cathode ray tube. Referring to curve 21, a maximum sensitivity is obtained in the vicinity of the bisazidocompound/diazocompound ratio of 5. This maximum sensitivity is more than twice that of the conventional azidocompound-type photoresist which is said to have an excellent sensitivity. It is also seen from the graph that the sensivitity of the diazocompound-type photoresist is significantly higher when the bisazidocompound/diazocompound ratio is 3 or less. Curve 21 was obtained with a PVP/PVA ratio of 1.

Figure 2:
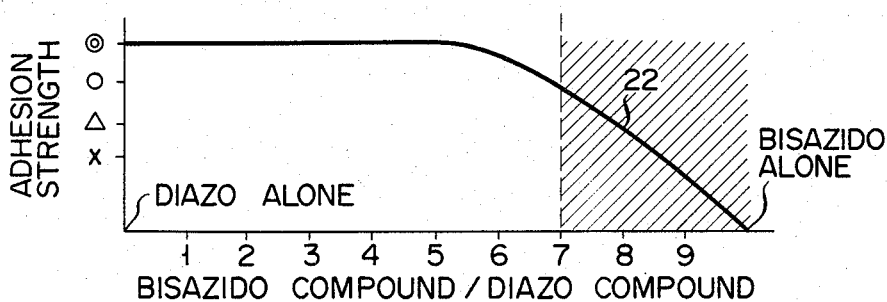

The results of a test on strength of adhesion to the faceplate are shown in FIG. 2. As may be seen from curve 22, the adhesion strength gradually decreases as the bisazidocompound/diazocompound ratio exceeds 7. Curve 22 was also obtained with a PVP/PVA ratio of 1. Referring to FIG. 2, symbol ⊚ represents excellent; o, good; Δ, fair; and ×, poor. Symbols ⊚ and o represent acceptable ranges.

Figure 3:
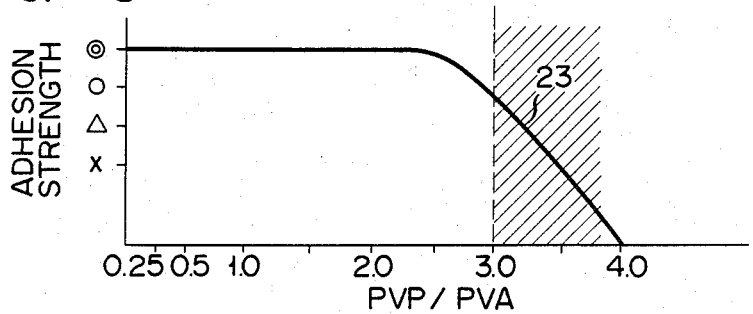
Figure 4:
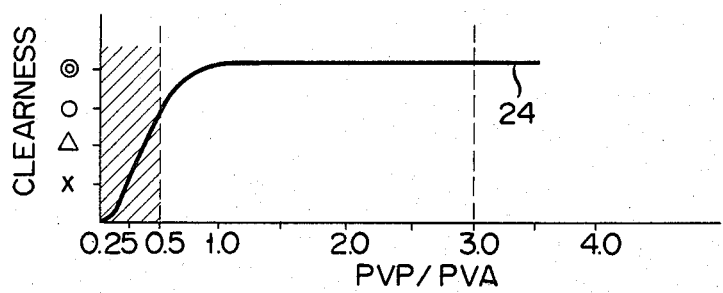

FIGS. 3 and 4 (composition numbers 1 to 7) show the results obtained in a test on adhesion strength and clearness of the photoresist pattern when the PVP/PVA ratio was varied. As may be seen from curves 23 and 24, the PVP/PVA ratio is preferably within the range of 0.5 to 3.0. Referring to FIGS. 3 and 4, symbols ⓞ , o, Δ, and × denote the same as in FIG. 2.

After forming a graphite film (non-light-emitting black material film) on the inner surface of a faceplate having a photoresist pattern obtained in this manner thereon, the pattern film was removed with saturated sulfamic acid soda. The pattern films of all compositions were easily removed and caused no problem during separation.

The storage stability of the photoresist aqueous solution was examined for three aqueous solutions of composition numbers 3, 8 and 14 which were left to stand at room temperature for one month before the test. As a result, the sensitivities of the water-soluble photoresist of composition numbers 3 and 14 respectively, that is, the water-soluble photoresist and the conventional azidocompound-type photoresist, remained substantially the same as initially. However, the photoresist of composition number 8, that is, the conventional diazo-compound-type photoresist required an exposure time of 60 seconds or more and had a sensitivity decreased to 50 to 70% of the initial value.

EXAMPLE 2

The procedures of Example 1 above were followed except that water-soluble photoresists of compositions shown in Table 2 below were prepared. The same tests as in Example 1 were also performed. As a result, the sensitivity under exposure for 13 seconds at an illumination of 30,000 lux was close to that of composition number 11 in Example 1.

Good results were also obtained for adhesion strength of the photoresist pattern, clearness of the photoresist pattern, and removal characteristics of the photoresist pattern with sulfamic acid soda.

Incidentally, "GATREZ" and "CYANAMA P-250" in Table 2 are a water-soluble polymeric material, respectively.

TABLE 2

| Composition of Water-Soluble Photoresist | |
|---|---|
| Compounds | Mixing Ratio (Parts by weight) |
| Copolymer "GANTREZ" (trade name; manufactured by GAF Co., Ltd., U.S.A.) of methyl vinyl ether and maleic anhydride | 0.50 |
| Polyacrylamide "CYANAMA P-250" (trade name; manufactured by American | 0.03 |

TABLE 2-continued

| Composition of Water-Soluble Photoresist | |
|---|---|
| Compounds | Mixing Ratio (Parts by weight) |
| Cyanamide Co., Ltd., U.S.A) Formalin condensation product (phosphate) of diazodiphenylamine | 1.90 |
| 4,4'-bisazidostilbene-2,2'-sodium disulfonate | 0.12 |
| Water | 97.45 |

EXAMPLE 3

The procedures of Example 1 above were followed except that water-soluble photoresists of compositions shown in Table 3 below were prepared. The same tests as in Example 1 were also performed.

Good results were also obtained for adhesion strength of the photoresist pattern, clearness of the photoresist pattern, and removal characteristics of the photoresist pattern with sulfamic acid soda.

TABLE 3

| Compounds | Amounts (Percent by weight) |
|---|---|
| PVP | 4 |
| PVA | 2 |
| Formalin condensation product (phosphate) of diazodiphenylamine | 0.12 |
| 4,4'-bisazidostilbene-2,2'-sodium disulfonate | 0.6 |
| Water | 93.28 |

What we claim is:

1. A photoresist composition for forming a pattern on the inner surface of a face plate of a color picture tube, said composition comprising an admixture
    of from 1 to 30% by weight based on the total amount of the photoresist of a water-soluble bisazido compound,
    a photosensitive water-soluble diazo compound, and
    from 0.5 to 50% by weight based on the total amount of the photoresist of a water-soluble polymeric material which when exposed to ultraviolet rays is capable of being cross-linked with at least one of said water-soluble bisazido compound and said water-soluble diazo compound, said polymeric material being an admixture of polyvinyl pyrrolidone and polyvinyl alcohol in a mixing ratio by weight of 0.5 to 3 parts polyvinyl pyrrolidone to 1 part of polyvinyl alcohol and the mixing ratio by weight of said water-soluble bisazido compound to said water-soluble diazo compound is 3 to 7 parts of said water soluble bisazido compound to 1 part of said water-soluble diazo compound.

2. A photoresist composition according to claim 1, further containing a surface active agent.

* * * * *